United States Patent
Chen et al.

(10) Patent No.: US 10,261,687 B2
(45) Date of Patent: Apr. 16, 2019

(54) PIN SHARING CIRCUIT, PIN SHARING METHOD, ELECTRONIC DEVICE AND ELECTRONIC WIRE USING THE SAME

(71) Applicant: PIXART IMAGING INC., Hsin-Chu (TW)

(72) Inventors: Yu-Han Chen, Hsin-Chu (TW); Chien-An Chen, Hsin-Chu (TW); Chi-Chieh Liao, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 15/651,030

(22) Filed: Jul. 17, 2017

(65) Prior Publication Data

US 2018/0074695 A1    Mar. 15, 2018

(30) Foreign Application Priority Data

Sep. 9, 2016 (TW) .............................. 105129312 A (51) Int. Cl.
| | |
|---|---|
| *G06F 3/048* | (2013.01) |
| *G06F 3/044* | (2006.01) |
| *G06F 3/0488* | (2013.01) |
| *G06F 3/02* | (2006.01) |
| *G06F 3/038* | (2013.01) |
| *H03K 17/96* | (2006.01) |
| *G06F 1/22* | (2006.01) |
| *G06F 3/041* | (2006.01) |

(52) U.S. Cl.
CPC ............ *G06F 3/04886* (2013.01); *G06F 1/22* (2013.01); *G06F 3/0202* (2013.01); *G06F 3/0227* (2013.01); *G06F 3/038* (2013.01); *G06F 3/044* (2013.01); *G06F 3/0416* (2013.01); *H03K 17/9622* (2013.01); *H03K 2217/96078* (2013.01)

(58) Field of Classification Search
CPC .... G06F 3/04886; G06F 3/0202; G06F 3/038; G06F 3/044; H03K 17/9622
USPC .......................................................... 341/33
See application file for complete search history.

(56) References Cited

U.S. PATENT DOCUMENTS

| | | | | |
|---|---|---|---|---|
| 5,528,002 | A * | 6/1996 | Katabami | ............... G06F 3/044 178/19.06 |
| 6,239,788 | B1 * | 5/2001 | Nohno | .................. G06F 3/0412 178/18.03 |
| 6,448,919 | B1 * | 9/2002 | Claxton | .............. H03M 1/1225 341/120 |
| 8,653,741 | B2 | 2/2014 | Monney | |

(Continued)

*Primary Examiner* — Omar Casillashernandez
(74) *Attorney, Agent, or Firm* — Li & Cai Intellectual Property (USA) Office (57) ABSTRACT

Provided herein are a pin sharing circuit, a pin sharing method and an electronic device, an electronic wire using the same. The pin sharing circuit enables at least one pin on an integrated circuit to be shared by a keyboard device and a touch panel and prevents signal interference between the keyboard device and the touch panel using an impedance element disposed on a wire for the pin, such that the pin can output or receive a stimulation signal and a sensor signal that contain both an AC component and a DC component so as to enhance the efficiency of the overall system and prevent the stimulation signal and the sensor signal from conflicts between the keyboard device and the touch panel.

12 Claims, 8 Drawing Sheets

(56) References Cited

U.S. PATENT DOCUMENTS

| | | | |
|---|---|---|---|
| 2007/0195058 A1* | 8/2007 | Lin | G06F 3/0338 345/156 |
| 2012/0001862 A1 | 1/2012 | Durbin et al. | |
| 2013/0147756 A1 | 6/2013 | Chan et al. | |
| 2016/0117074 A1* | 4/2016 | Gentile | G06F 3/044 345/168 |

* cited by examiner

PIN SHARING CIRCUIT, PIN SHARING METHOD, ELECTRONIC DEVICE AND ELECTRONIC WIRE USING THE SAME

BACKGROUND

1. Technical Field

The present invention generally relates to a pin sharing circuit, a pin sharing method, an electronic device and an electronic wire using the same and, more particularly, to a pin sharing circuit and a pin sharing method used between a keyboard device and a touch panel, and an electronic device and an electronic wire using the pin sharing circuit and the pin sharing method.

2. Description of Related Art

With the advancement of semiconductor processing technology, the development of integrated circuits (ICs) has been trending towards compactness and higher performance. Furthermore, some integrated circuits can directly control a plurality of peripheral devices. For example, a keyboard device that has been widely used with various electronic products can be controlled by an integrated circuit to receive a stimulation signal from a pin on the integrated circuit and determine whether a button on the keyboard device is being pressed. Similarly, a touch panel can also be controlled by the integrated circuit to receive a stimulation signal from a pin on the integrated circuit and determine whether a certain section button on the touch panel is being touched.

Accordingly, when the keyboard device and the touch panel are commonly connected to an integrated circuit, the number of pins on the integrated circuit has to be multiplied. The increase of the number of pins on the integrated circuit results in the complexity of chip packaging and the cost of manufacture, which affects the chip packaging yield. Therefore, some pins on an integrated circuit are preferably designed to be shared by the keyboard device and the touch panel.

However, the stimulation signals from the pins on the integrated circuit received by the keyboard device and the touch panel include different types of electricity components such as an alternate current (AC) component and a direct current (DC) component and cannot be replaced by any other stimulation signals. Therefore, it is crucial to enable some pins on the integrated circuit to be shared by the keyboard device and the touch panel and to prevent the stimulation signals from the pins from conflicts between the keyboard device and the touch panel.

SUMMARY

One embodiment of the present invention provides a pin sharing circuit for use between a keyboard device and a touch panel. The pin sharing circuit includes an integrated circuit including at least one first shared pin and a first wire. The first shared pin is configured to output a stimulation signal containing an alternating current (AC) component and a direct current (DC) component. The first wire is configured to enable the at least one first shared pin on the integrated circuit to be coupled to an input terminal of the keyboard device and an input terminal of the touch panel. The first wire includes a first impedance element coupled between the input terminal of the keyboard device and the at least one first shared pin and configured to filter the stimulation signal so as to filter out the AC component of the stimulation signal.

Preferably, the first impedance element includes at least one passive element and/or at least one diode.

One embodiment of the present invention further provides a pin sharing method for use between a keyboard device and a touch panel. The pin sharing method includes the following steps. A stimulation signal containing an AC component and a DC component is outputted from at least one first shared pin on an integrated circuit. A first wire is used to enable the at least one first shared pin on the integrated circuit to be coupled to an input terminal of the keyboard device and an input terminal of the touch panel. The first wire includes a first impedance element coupled between the input terminal of the keyboard device and the at least one first shared pin. The first impedance element is used to filter the stimulation signal so as to filter out the AC component of the stimulation signal.

Preferably, the first impedance element includes at least one passive element and/or at least one diode.

One embodiment of the present invention further provides an electronic device. The electronic device includes a keyboard device, a touch panel and a pin sharing circuit. The pin sharing circuit includes an integrated circuit including at least one first shared pin and a first wire. The first shared pin is configured to output a stimulation signal containing an alternating current (AC) component and a direct current (DC) component. The first wire is configured to enable the at least one first shared pin on the integrated circuit to be coupled to an input terminal of the keyboard device and an input terminal of the touch panel. The first wire includes a first impedance element coupled between the input terminal of the keyboard device and the at least one first shared pin and configured to filter the stimulation signal so as to filter out the AC component of the stimulation signal.

Preferably, the first impedance element includes at least one passive element and/or at least one diode.

One embodiment of the present invention further provides an electronic wire applicable to an integrated circuit sharing at least one output pin. The electronic wire includes a first connecting terminal, a second connecting terminal, a third connecting terminal and a Y-shaped connecting structure. The first connecting terminal is coupled to the at least one output pin and configured to receive a stimulation signal containing an alternating current (AC) component and a direct current (DC) component provided by the at least one output pin. The second connecting terminal is coupled to an input terminal of a first electronic device and configured to provide the first electronic device with the stimulation signal containing the DC component. The third connecting terminal is coupled to an input terminal of a second electronic device and configured to provide the second electronic device with the stimulation signal containing the AC component. The Y-shaped connecting structure is connected to the first connecting terminal, the second connecting terminal and the third connecting terminal and configured to electrically connect one another. The Y-shaped connecting structure includes an impedance element coupled between the second connecting terminal and the first connecting terminal and configured to filter the stimulation signal so as to filter out the AC component of the first sensor signal.

Preferably, the impedance element includes at least one passive element and/or at least one diode.

Preferably, the first electronic device is different from the second electronic device, and the first electronic device affects the second electronic device as a capacitor.

One embodiment of the present invention further provides an electronic wire applicable to an integrated circuit sharing at least one input pin. The electronic wire includes a first connecting terminal, a second connecting terminal, a third connecting terminal and a Y-shaped connecting structure. The first connecting terminal is coupled to the at least one input pin and configured to receive a first sensor signal provided by an output terminal of a first electronic device and a second sensor signal provided by an output terminal of a second electronic device. The second connecting terminal is coupled to the output terminal of the first electronic device. The third connecting terminal is coupled to the output terminal of the second electronic device. The Y-shaped connecting structure is connected to the first connecting terminal, the second connecting terminal and the third connecting terminal and configured to electrically connect one another. The Y-shaped connecting structure includes an impedance element coupled between the second connecting terminal and the first connecting terminal and configured to filter the stimulation signal so as to filter out an AC component of the first sensor signal.

Preferably, the impedance element includes at least one passive element and/or at least one diode.

Preferably, the first electronic device is different from the second electronic device, and the first electronic device affects the second electronic device as a capacitor.

As previously stated, the present invention provides a pin sharing circuit, a pin sharing method and an electronic device, an electronic wire using the same so as to enable the at least one pin on an integrated circuit to be shared by the keyboard device and the touch panel. An impedance element is added to the wire for the pin to prevent signal interference between a keyboard device and a touch panel, such that the pin can output or receive a stimulation signal and a sensor signal that contain both an AC component and a DC component so as to enhance the efficiency of the overall system and prevent the stimulation signal and the sensor signal from conflicts between the keyboard device and the touch panel.

In order to further understand the techniques, means and effects of the present invention, the following detailed descriptions and appended drawings are hereby referred to, such that, and through which, the purposes, features and aspects of the present invention can be thoroughly and concretely appreciated; however, the appended drawings are merely provided for reference and illustration, without any intention to be used for limiting the present invention.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain the principles of the present invention.

DESCRIPTION OF THE EXEMPLARY EMBODIMENTS

The detailed description set forth below in connection with the appended drawings is intended as a description of certain embodiments of the present invention, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present invention.

Figure 1:
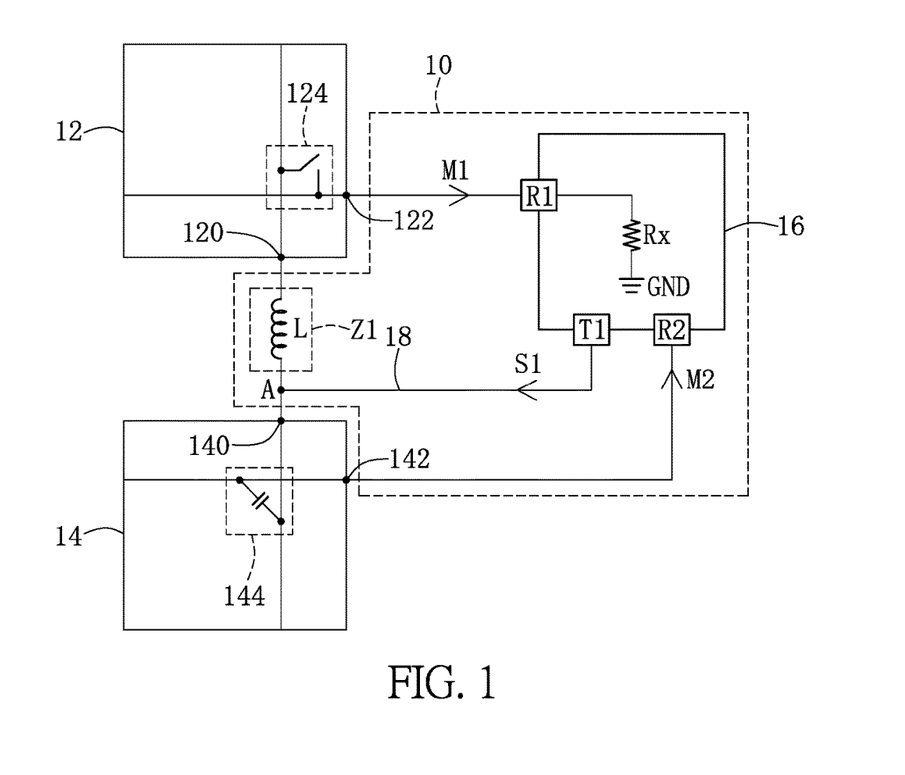
FIG. 1 is a schematic diagram of a pin sharing circuit according to one embodiment of the present invention.

Referring to FIG. 1, FIG. 1 is a schematic diagram of a pin sharing circuit according to one embodiment of the present invention. The pin sharing circuit 10 is for use between a keyboard device 12 and a touch panel 14, to which, however, the present invention is not limited. In other words, the present invention is not limited to examples of the keyboard device 12 and the touch panel 14. Accordingly, those persons with ordinary skill in the art may design the keyboard device 12 and the touch panel 14 according to actual demands or practical applications.

Take a button section 124 of the keyboard device 12 for example. The keyboard device 12 receives a stimulation signal containing a DC component and outputs a sensor signal containing the DC component. Therefore, when the button section 124 is being pressed, the DC level of the sensor signal changes accordingly to indicate that the button section 124 is being pressed. Relatively, take a touch section 144 of the touch panel 14 for example. The touch panel 14 receives a stimulation signal containing an AC component and outputs a sensor signal containing the DC component. Therefore, when the touch section 144 senses a conductor (for example, a finger) approaching, the equivalent capacitance of the touch section 144 changes accordingly to change the characteristics of the output sensor signal (for example, the voltage, the current, etc.), thereby indicating that the touch section 144 is being touched. It should be noted that, since the keyboard device 12 and the touch panel 14 are known, the previous descriptions are only exemplary and detailed descriptions thereof are not presented.

However, the characteristics of the stimulation signal and the sensor signal received and outputted by the keyboard device 12 and the touch panel 14 are not completely identical (for example, the DC component or the AC component). In the present invention, when the input terminal or the output terminal of the keyboard device 12 and the touch panel 14 shares a pin on the integrated circuit 16, an impedance element can be added to a conductive path connecting the keyboard device 12 to avoid the signal interference.

More particularly, if the input terminal 120 of the keyboard device 12 and the input terminal 140 of the touch panel 14 share an output pin on the integrated circuit 16, the pin sharing circuit 10 includes an integrated circuit 16 including at least one first shared pin T1, and a first wire 18. The first shared pin T1 is configured to output a stimulation signal S1 containing an AC component and a DC component. The first wire 18 is configured to enable the at least one first shared pin T1 on the integrated circuit 16 to be coupled to an input terminal 120 of the keyboard device 12 and an input terminal 140 of the touch panel 14.

However, since the button section 124 of the keyboard device 12 functions as an equivalent capacitor as viewed from the input node 120, the AC component of the stimulation signal S1 outputted from the first shared pin T1 is fed into the keyboard device 12 to affect the touch panel 14. When the button section 124 is being pressed, the capacitance of the equivalent capacitor of the button section 124 varies significantly, such that the extent of the feeding of the AC component of the stimulation signal S1 also varies.

Therefore, the first wire 18 further includes a first impedance element Z1 coupled between the input terminal 120 of the keyboard device 12 and the at least one first shared pin T1 and configured to filter the stimulation signal S1 so as to filter out the AC component of the stimulation signal S1 and inhibit the equivalent capacitor to be formed on the keyboard device 12 to affect the touch panel 14. The filtering not only filters out the AC component on the conductive path, but also stops the conduction of the AC component, such that there is no equivalent capacitor, for the first shared pin T1, to be formed on the keyboard device 12, and the AC component of the stimulation signal S1 is mostly fed into the touch panel 14 without flowing through the keyboard device 12.

For better understanding, the at least one first shared pin T1 in the present embodiment is exemplified by a first shared pin T1, to which, however, the present invention is not limited. According to the previous teachings, those persons with ordinary skill in the art would understand that the pin sharing circuit 10 may further include at least one first input pin R1 and at least one second input pin R2, both disposed on the integrated circuit 16. The first input pin R1 is configured to receive a first sensor signal M1 outputted by an output terminal 122 of the keyboard device 12 and enable the integrated circuit 16 to determine whether the button section 124 disposed between the input terminal 120 and the output terminal 122 on the keyboard device 12 is being pressed.

It should be noted that the button section 124 is pressed to function as a switch being turned on, as shown in FIG. 1. Therefore, according to the previous teachings, those persons with ordinary skill in the art would understand that the first input pin R1 may further include a resistor Rx. For example, the first terminal of the resistor Rx is coupled to the first input pin R1 on the integrated circuit 16, while the second terminal of the resistor Rx is coupled to a ground voltage GND. Accordingly, under the circumstances that the output of the stimulation signal S1 is at a high level, when the switch is being turned on, the resistor Rx can generate a voltage variation from a low level to a high level. Therefore, the integrated circuit 16 can determine whether the button section 124 is being pressed.

It should be noted the present embodiment is exemplified by a voltage variation from a low level to a high level to determine whether the button section 124 is being pressed, to which the present invention is not limited. In other embodiments, the resistor Rx may also generate a voltage variation from a high level to a low level, such that the integrated circuit 16 can determine whether the button section 124 is being pressed. In brief, the present invention is not limited to the previous example of the resistor Rx, and those persons with ordinary skill in the art may design the resistor Rx according to actual demands or practical applications.

The at least one second input pin R2 is configured to receive a second sensor signal M2 outputted by an output terminal 142 of the touch panel 14, and enables the integrated circuit 16 to determine whether the touch section 144 disposed between the input terminal 140 and the output terminal 142 on the touch panel 14 is being touched. However, since the operation principles of the keyboard device 12 and the touch panel 14 are known, descriptions thereof are not repeated herein.

It should be understood that the impedance element Z1 includes at least one passive element and/or at least one diode. In other words, the impedance element Z1 may not only include a resistor, a capacitor, or an inductor, but also a diode, or any combination of various passive elements (i.e., a resistor, a capacitor and an inductor) and/or the diode. For example, when the impedance element Z1 includes an inductor, the conduction of the AC component can be interrupted by the inductor. When the impedance element Z1 includes a resistor, a resistor-capacitor (RC) circuit is formed by the resistor with the equivalent capacitor of the keyboard device 12 to stop the conduction of the AC component. When the impedance element Z1 includes a capacitor, the capacitor of the impedance element Z1 can be connected to a ground voltage, such that the AC component flowing through the keyboard device 12 is fixed without affecting the touch panel 14. In brief, the present invention is not limited to the previous example of the impedance element Z1. However, for the convenience of descriptions herein, the present embodiment uses an impedance element Z1 including an inductor L as an example. In other words, the impedance element Z1 is formed by an inductor L, to which, however, the present invention is not limited.

More particularly, a first terminal of the inductor L is coupled to an input terminal 120 of the keyboard device 12, while a second terminal of the inductor L is coupled to a node A between the first shared pin T1 and an input terminal 140 of the touch panel 14. Therefore, when the output of the first shared pin T1 contains a stimulation signal S1 containing an AC component and a DC component, the inductor L (i.e., the impedance element Z1) filters out the AC component, such that the input terminal 120 of the keyboard device 12 only receives the DC component of the stimulation signal S1. Since the touch panel 14 is a touch sensor based on capacitive coupling, the touch panel 14 regards the DC component to be ineffective. In addition, since the impedance element Z1 is disposed on the conductive path between the touch panel 14 and the keyboard device 12, the AC component of the stimulation signal S1 can be suppressed to be fed into the keyboard device 12.

According to the previous teachings, those persons with ordinary skill in the art would understand that one spirit of the present invention is to enable at least one output pin on the integrated circuit 16 (i.e., the first shared pin T1) to be shared by the keyboard device 12 and the touch panel 14. An impedance element Z1 is added to the wire for the output pin to filter out the AC component of the stimulation signal S1 transmitted to the keyboard device 12, such that the integrated circuit 16 can use the first shared pin T1 to output the stimulation signal S1 containing the AC component and the DC component so as to enhance the efficiency of the overall system and prevent the stimulation signal S1 from conflicts between the keyboard device 12 and the touch panel 14.

It should be noted that the previous example of the impedance element Z1 is only exemplary and is not intended to limit the present invention. For example, in other embodiments, when the impedance element Z1 includes a single resistor Ry (not shown), the first terminal of the resistor Ry is coupled to the input terminal 120 of the keyboard device 12, and the second terminal of the resistor Ry is coupled to the node A between the first shared pin T1 and the input terminal 140 of the touch panel 14. The keyboard device 12 functions as an equivalent capacitor as viewed from the node A. When the first shared pin T1 outputs a stimulation signal S1 containing both an AC component and a DC component, the resistor Ry and the equivalent capacitor formed by the keyboard device 12 similarly filter out the AC component, such that the input terminal 120 of the keyboard device 12 only receives the DC component of the stimulation signal S1.

It should be noted that, when the first input pin R1 on the integrated circuit 16 includes a resistor Rx, under the circumstances that the impedance element Z1 includes only the resistor Ry, the resistance of the resistor Ry is preferably larger than 1 KΩ, and the resistance of the resistor Rx is preferably larger than that of the resistor Ry (for example, the resistance of the resistor Rx is 100 KΩ). In brief, the present invention is not limited to the previous example of the impedance element Z1, and those persons with ordinary skill in the art may design the impedance element Z1 according to actual demands or practical applications.

In other embodiments, the integrated circuit 16 may also use the first shared pin T1 to output the stimulation signal S1 containing the AC component or the DC component during different time periods. In other words, the time the stimulation signal contains the AC component and the time the stimulation signal contains the DC component may be staggered from each other. Accordingly, when the first shared pin T1 outputs a stimulation signal S1 only containing the AC component, the impedance element Z1 (for example, the inductor L in FIG. 1) still filters out the AC component, such that the input terminal 120 of the keyboard device 12 only receives the DC component of the stimulation signal S1. Similarly, when the first shared pin T1 outputs a stimulation signal S1 only containing the DC component, the touch panel 14 regards the DC component to be ineffective.

Figure 2A:
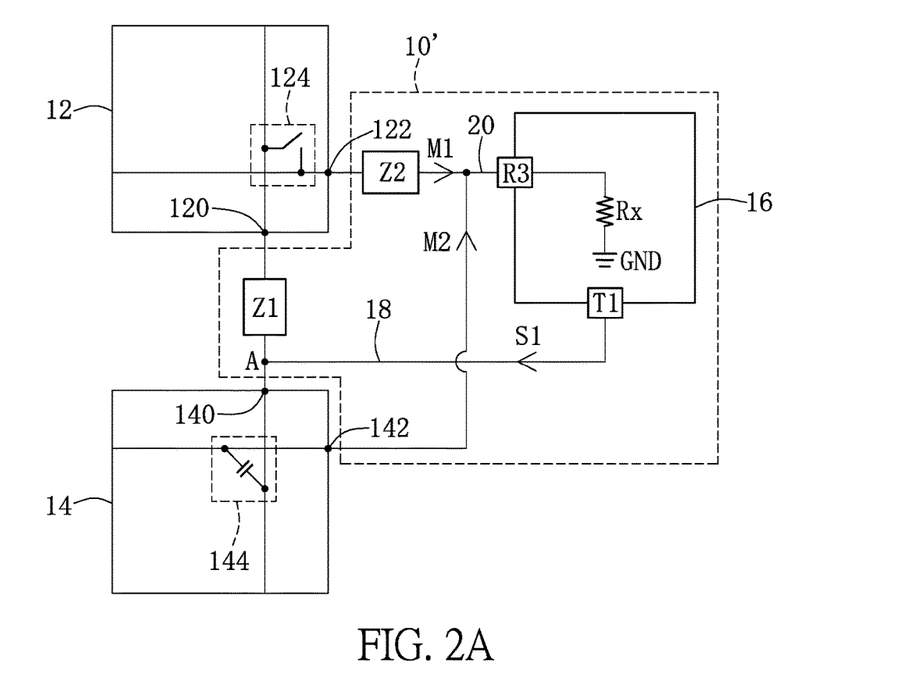
FIG. 2A is a schematic diagram of a pin sharing circuit according to another embodiment of the present invention.

Accordingly, considering that the time the stimulation signal S1 contains the AC component and the time the stimulation signal S1 contains the DC component are staggered from each other, the present invention further provides another embodiment. Referring to FIG. 2A, FIG. 2A is a schematic diagram of a pin sharing circuit according to another embodiment of the present invention. Some elements in FIG. 2A are labeled in the same way as some elements in FIG. 1, and descriptions thereof are not presented.

More particularly, compared to the pin sharing circuit 10 in FIG. 1, the pin sharing circuit 10' in FIG. 2A further includes at least one second shared pin R3 disposed on an integrated circuit 16 and a second wire 20. The second shared pin R3 is configured to receive a first sensor signal M1 outputted by an output terminal 122 of the keyboard device 12 and a second sensor signal M2 outputted by an output terminal 142 of the touch panel 14.

Moreover, the second wire 20 is configured to enable the at least one second shared pin R3 on the integrated circuit 16 to be coupled to the output terminal 122 of the keyboard device 12 and the output terminal 142 of the touch panel 14. The second wire 20 further includes another impedance element Z2 coupled between the output terminal 122 of the keyboard device 12 and the at least one second shared pin R3 and configured to filter the first sensor signal M1 so as to filter out the AC component of the first sensor signal M1 and prevent the equivalent capacitor to be formed on the keyboard device 12 from affecting the touch panel 14.

For better understanding, the at least one second shared pin R3 in the present embodiment is exemplified by a second shared pin R3, to which, however, the present invention is not limited number of the at least one second shared pin. Moreover, the impedance element Z2 is designed to be identical to the impedance element Z1, or the impedance element Z2 may also be designed to be different from the impedance element Z1, to which, however, the present invention is not limited. In brief, the present invention is not limited to the previous example of the impedance element Z2. In other words, the impedance element Z2 includes at least one passive element and/or at least one diode.

According to the previous teachings, those persons with ordinary skill in the art would understand that, when the output terminal 122 of the keyboard device 12 outputs the first sensor signal M1, the impedance element Z2 filters out the AC component, such that the second shared pin R3 only receives the DC component of the first sensor signal M1. Similarly, when the output terminal 142 of the touch panel 14 outputs the second sensor signal M2, the integrated circuit 16 regards the DC component of the first sensor signal M1 to be ineffective.

In other words, the pin sharing circuit 10' in the present embodiment uses time-sharing operations of the first shared pin T1 to differentiate the sensing results of the keyboard device 12 and the touch panel 14, such that the integrated circuit 16 can use the same input pin (i.e., the second shared pin R3) to receive the first sensor signal M1 and the second sensor signal M2 from the keyboard device 12 and the touch panel 14, respectively so as to minimize the number of pins on the integrated circuit 16 and reduce the cost of circuit design and enhance the chip packaging yield.

Figure 2B:
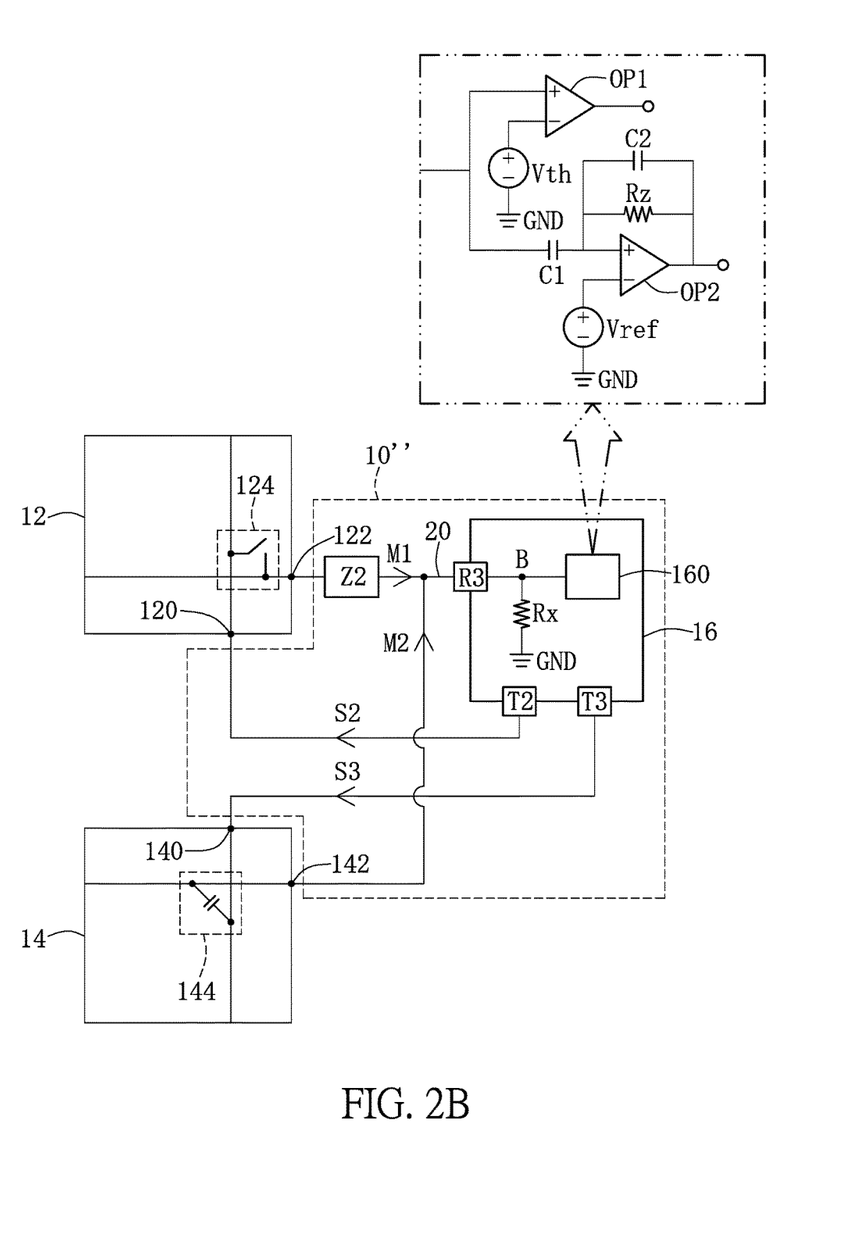
FIG. 2B is a schematic diagram of a pin sharing circuit according to another embodiment of the present invention.

The present invention further provides another embodiment. Referring to FIG. 2B, FIG. 2B is a schematic diagram of a pin sharing circuit according to another embodiment of the present invention. Some elements in FIG. 2B are labeled in the same way as some elements in FIG. 2A, and descriptions thereof are not presented.

More particularly, compared to the pin sharing circuit 10' in FIG. 2A, the pin sharing circuit 10" in FIG. 2B does not include a first shared pin T1 disposed on an integrated circuit 16 and a first wire 18. Relatively, the pin sharing circuit 10" includes at least one first output pin T2 and at least one second output pin T3 disposed on an integrated circuit 16. The first output pin T2 is configured to output a stimulation signal S2 containing a DC component, while the second output pin T3 is configured to output a stimulation signal S3 containing an AC component.

The pin sharing circuit 10" in the present embodiment uses the first output pin T2 and the second output pin T3 to output the stimulation signal S2 containing the DC component and the stimulation signal S3 containing the AC component, respectively. Therefore, the pin sharing circuit 10" in FIG. 2B can be a circuit where the output terminal 122 of the keyboard device 12 and the output terminal 142 of the touch panel 14 share an input pin on the integrated circuit 16 (i.e., the second shared pin R3 in FIG. 2B). The integrated circuit 16 further includes a sensor element 160. The sensor element 160 is coupled to a node B between the second shared pin R3 and the resistor Rx, and is used to differentiate the first sensor signal M1 and the second sensor signal M2, such that the integrated circuit 16 can use the first output pin T2 and the second output pin T3 to respectively output the stimulation signal S2 containing the DC component and the stimulation signal S3 containing the AC component at the same time. It should be noted that FIG. 2B shows an embodiment of the sensor element 160, to which the present invention is not limited. Moreover, in the present embodiment, since the operational amplifiers OP1 and OP2, the reference voltages Vth and Vref, the capacitors C1 and C2, and the resistor Rz are known to those persons with ordinary skill in the art, detailed description of the sensor element 160 is not presented.

Figure 2C:
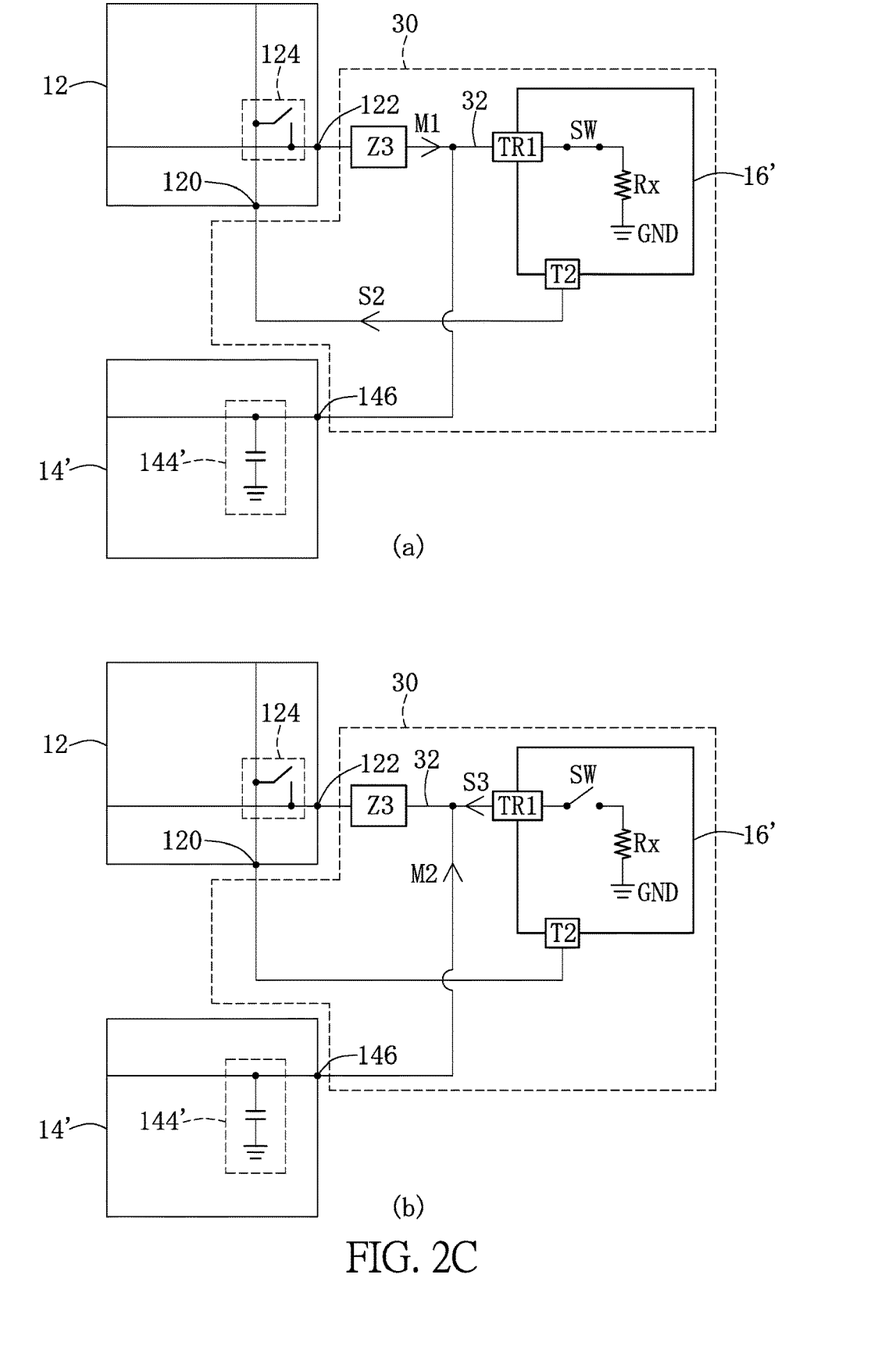
FIG. 2C is a schematic diagram of a pin sharing circuit according to another embodiment of the present invention.

Considering that the touch panel 14 can be a self-capacitance touch sensor, the present invention further provides another embodiment. Referring to FIG. 2C, FIG. 2C is a schematic diagram of a pin sharing circuit according to another embodiment of the present invention. Some elements in FIG. 2C are labeled in the same way as some elements in FIGS. 1-2B, and descriptions thereof are not presented.

More particularly, compared to the touch panel 14 in FIGS. 1-2B, the touch panel 14' in FIG. 2C is a self-capacitance touch sensor. Take a touch section 144' of the touch panel 14' for example, the touch section 144' only receives and outputs the stimulation signal and the sensor signal at one terminal of the touch panel 14' (for example, the first terminal 146). It should be noted that, since the self-capacitance touch sensor is conventional, description thereof is not presented.

Moreover, the pin sharing circuit 30 in FIG. 2C includes an integrated circuit 16' including the first output pin T2 and at least one composite pin TR1, and a third wire 32. The third wire 32 is configured to enable the at least one composite pin TR1 on the integrated circuit 16' to be coupled to the output terminal 122 of the keyboard device 12 and a first terminal 146 of the touch panel 14', respectively.

It should be understood that the third wire 32 may include another impedance element Z3 coupled between the output terminal 122 of the keyboard device 12 and the at least one composite pin TR1 and configured to filter the first sensor signal M1 so as to filter out the AC component of the first sensor signal M1 and prevent the equivalent capacitor to be formed on the keyboard device 12 from affecting the touch panel 14'.

For better understanding, the at least one composite pin TR1 in the present embodiment is exemplified by a composite pin TR1, to which, however, the present invention is not limited. Moreover, the impedance element Z3 is designed to be identical to the impedance element Z2, or the impedance element Z3 may also be designed to be different from the impedance element Z2, to which, however, the present invention is not limited. In brief, the present invention is not limited to the previous example of the impedance element Z3.

According to the previous teachings, those persons with ordinary skill in the art would understand that, when a button section 124 of the keyboard device 12 is being sensed, the first output pin T2 is configured to output a stimulation signal S2 containing the DC component to the input terminal 120 of the keyboard device 12 and the impedance element Z3 filters out the AC component, such that the composite pin TR1 only receives the DC component of the first sensor signal M1, thereby determining whether the button section 124 is being pressed. In other words, the composite pin TR1 is regarded as an input pin on the integrated circuit 16', as shown in FIG. 2C(a).

Relatively, when a touch section 144' of the touch panel 14' is being sensed, the composite pin TR1 is configured to output a stimulation signal S3 containing the AC component to the first terminal 146 of the touch panel 14', such that the composite pin TR1 receives a second sensor signal M2 from the first terminal 146 of the touch panel 14', and determines whether the touch section 144' is being touched. In other words, the composite pin TR1 is regarded as an I/O pin on the integrated circuit 16', as shown in FIG. 2C(b).

In other words, because the pin sharing circuit 30 in the present embodiment uses the self-capacitance touch sensor, a pin (i.e., the composite pin TR1) on the integrated circuit 16' is used as an I/O pin, such that the number of pins on the integrated circuit 16' and the cost of circuit design can be reduced.

It should be noted that, if the touch section 144' is being sensed, under the circumstances that the composite pin TR1 is used as an I/O pin, the integrated circuit 16' preferably includes a switch SW, and the switch SW turns off the conduction between the composite pin TR1 and the resistor Rx, such that the touch panel 14' functions normally. In brief, the present invention is not limited to the previous example of the switch SW, and those persons with ordinary skill in the art may design the switch SW according to actual demands or practical applications.

Figure 2D:
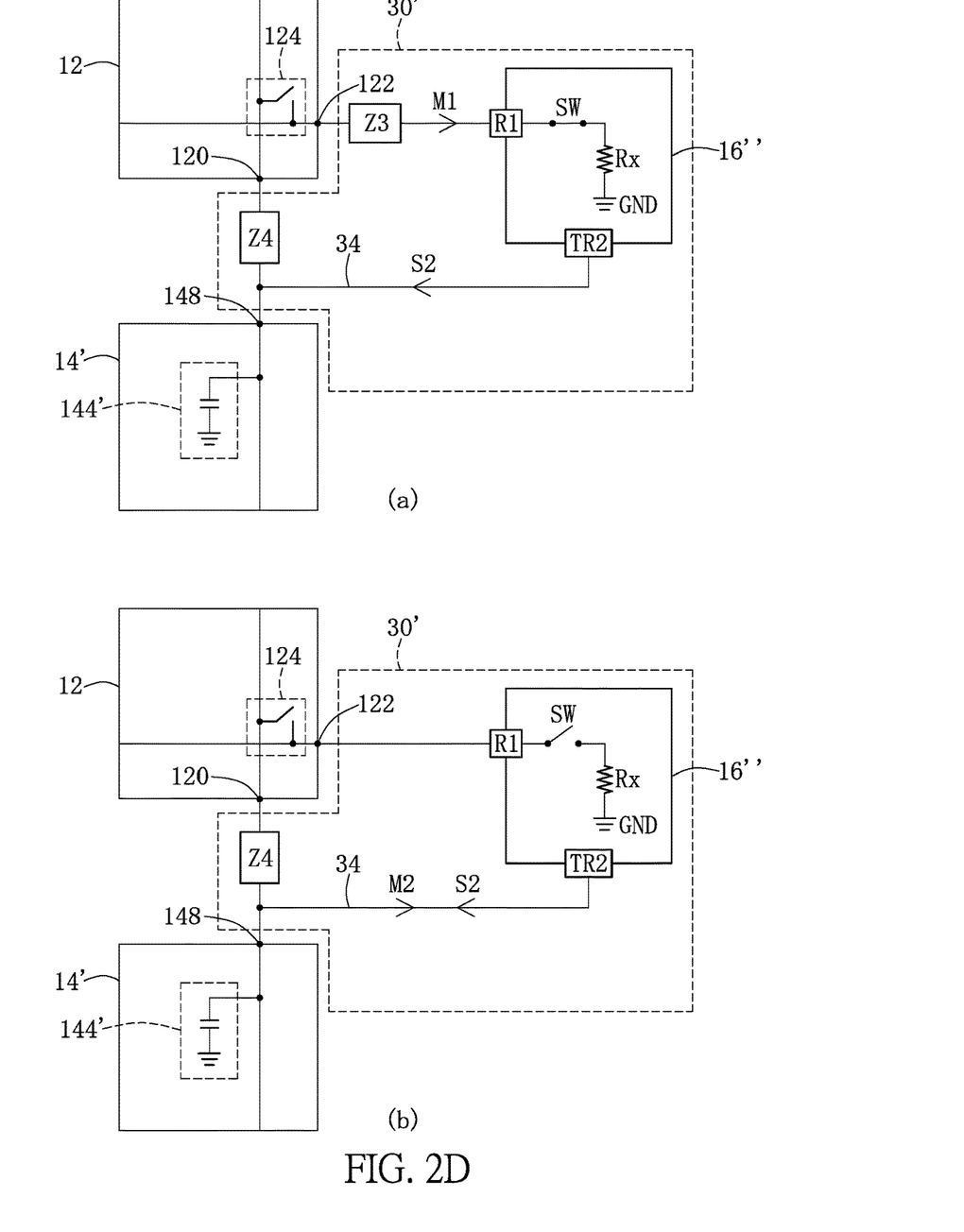
FIG. 2D is a schematic diagram of a pin sharing circuit according to another embodiment of the present invention.

The present invention further provides another embodiment. Referring to FIG. 2D, FIG. 2D is a schematic diagram of a pin sharing circuit according to another embodiment of the present invention. Some elements in FIG. 2D are labeled in the same way as some elements in FIG. 2C, and descriptions thereof are not presented.

More particularly, compared to the pin sharing circuit 30 in FIG. 2C, the pin sharing circuit 30' in FIG. 2D includes an integrated circuit 16" including the first input pin R1 and at least one composite pin TR2, and a fourth wire 34. The wire 34 is configured to enable the at least one composite pin TR2 on the integrated circuit 16" to be coupled to an input terminal 120 of a keyboard device 12 and a second terminal 148 of a touch panel 14', respectively.

It should be understood that the fourth wire 34 further includes another impedance element Z4 coupled between the input terminal 120 of the keyboard device 12 and the at least one composite pin TR2 and configured to filter the stimulation signals S2 and S3 so as to filter out the AC components of the stimulation signals S2 and S3 and prevent the equivalent capacitor to be formed on the keyboard device 12 from affecting the touch panel 14'.

For better understanding, the at least one composite pin TR2 in the present embodiment is exemplified by a composite pin TR2, to which, however, the present invention is not limited. Moreover, the impedance element Z4 is designed to be identical to the impedance element Z1, or the impedance element Z4 may also be designed to be different from the impedance element Z1, to which, however, the present invention is not limited. In brief, the present invention is not limited to the previous example of the impedance element Z4.

According to the previous teachings, those persons with ordinary skill in the art would understand that, when a button section 124 of the keyboard device 12 is being sensed, the composite pin TR2 is configured to output a stimulation signal S2 containing the DC component and the impedance element Z4 filters out the AC component, such that the input terminal 120 of the keyboard device only receives the DC component of the stimulation signal S2. Then, the first input pin R1 only receives first sensor signal M1 from the output terminal 122 of the keyboard device 12 so as to determine whether the button section 124 is being pressed. In other words, the composite pin TR2 is regarded as an input pin on the integrated circuit 16", as shown in FIG. 2D(a).

Relatively, when a touch section 144' of the touch panel 14' is being sensed, the composite pin TR2 is configured to output a stimulation signal S3 containing the AC component to the second terminal 148 of the touch panel 14', such that the composite pin TR2 receives a second sensor signal M2 from the second terminal 148 of the touch panel 14', and determines whether the touch section 144' is being touched. In other words, the composite pin TR2 is regarded as an I/O pin on the integrated circuit 16", as shown in FIG. 2D(b).

In other words, because the pin sharing circuit 30' in the present embodiment uses the self-capacitance touch sensor, a pin (i.e., the composite pin TR2) on the integrated circuit 16" is used as an I/O pin, such that the number of pins on the integrated circuit 16" and the cost of circuit design can be reduced.

However, it should be understood that the previous embodiments only exemplify the present invention. In other words, the present invention may be implemented by many different modes and is not limited to the previous embodiments.

Figure 3:
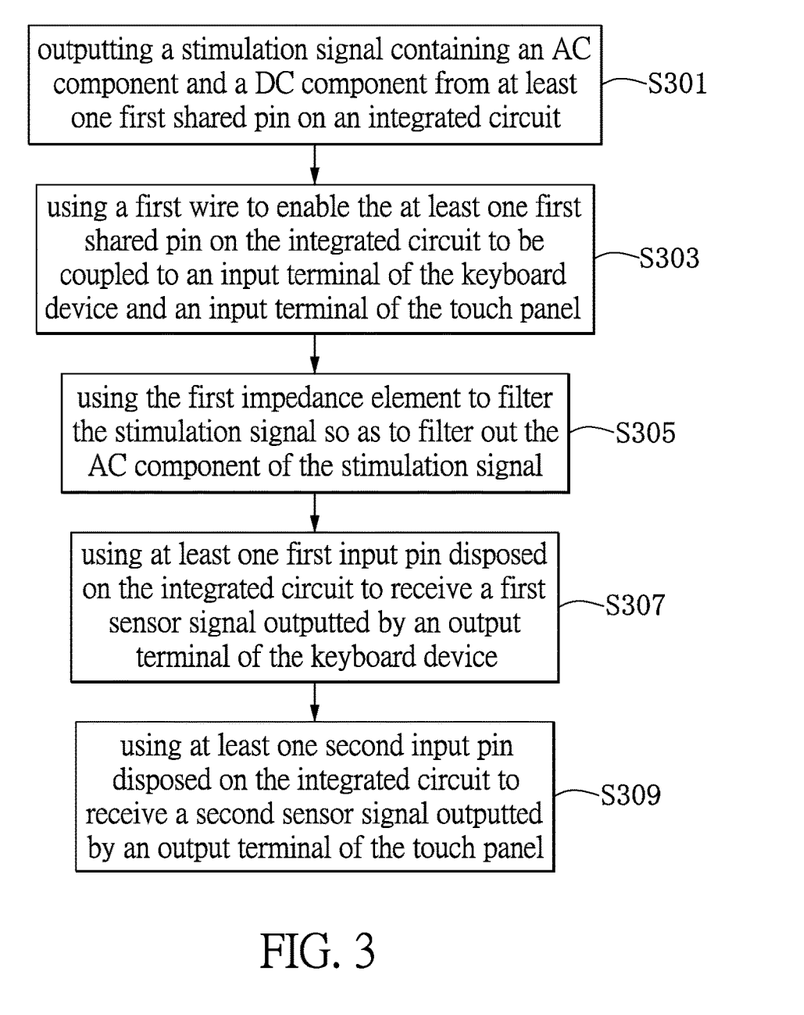
FIG. 3 is a flowchart of a pin sharing method according to one embodiment of the present invention.

To further describe the operations of the pin sharing circuit 10, the present invention further provides a pin sharing method according to one embodiment. Referring to FIG. 3, FIG. 3 is a flowchart of a pin sharing method according to one embodiment of the present invention. The pin sharing method according to the present embodiment can be performed by the pin sharing circuit 10 in FIG. 1, and please refer to FIG. 1 for better understanding. Detailed descriptions of the steps are disclosed in the previous embodiments and thus are not repeated.

First, in Step S301, a stimulation signal S1 containing an AC component and a DC component is outputted from at least one first shared pin T1 on an integrated circuit 16. Then, in Step S303, a first wire 18 is used to enable the at least one first shared pin T1 on the integrated circuit 16 to be coupled to an input terminal 120 of the keyboard device 12 and an input terminal 140 of the touch panel 14, wherein the first wire 18 includes an impedance element Z1 coupled between the input terminal 120 of the keyboard device 12 and the at least one first shared pin T1. Afterwards, in Step S305, the impedance element Z1 is used to filter the stimulation signal S1 so as to filter out the AC component of the stimulation signal S1 and prevent the equivalent capacitor to be formed on the keyboard device 12 from affecting the touch panel 14.

As previously stated, the impedance element Z1 includes at least one passive element and/or at least one diode. Moreover, the integrated circuit 16 can use the first shared pin T1 to output the stimulation signal S1 containing the AC component and the DC component so as to enhance the efficiency of the overall system and prevent the stimulation signal S1 from conflicts between the keyboard device 12 and the touch panel 14.

It should be understood that the pin sharing method in FIG. 3 further includes Step S307 and Step S309. In Step S307, at least one first input pin R1 disposed on the integrated circuit 16 is used to receive a first sensor signal M1 outputted by an output terminal 122 of the keyboard device 12 and enable the integrated circuit 16 to determine whether a button section 124 disposed between the input terminal 120 and the output terminal 122 on the keyboard device 12 is being pressed. Similarly, in Step S309, at least one second input pin R2 disposed on the integrated circuit 16 is used to receive a second sensor signal M2 outputted by an output terminal 142 of the touch panel 14 and enable the integrated circuit 16 to determine whether the touch section 144 disposed between the input terminal 140 and the output terminal 142 on the touch panel 14 is being touched. According to the previous teachings, those persons with ordinary skill in the art would understand that Step S307 and Step S309 can be performed in parallel without having conflicts.

Figure 4:
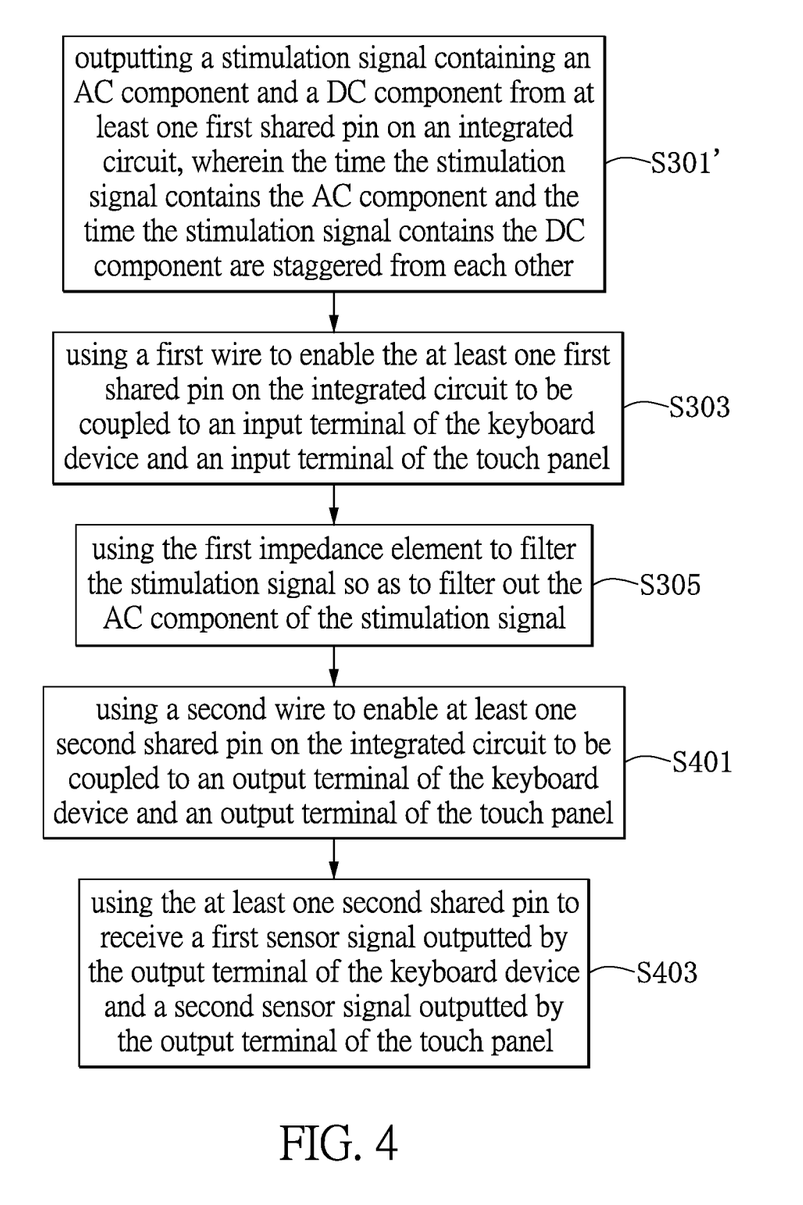
FIG. 4 is a flowchart of a pin sharing method according to another embodiment of the present invention.

Considering that the time the stimulation signal S1 contains the AC component and the time the stimulation signal S1 contains the DC component are staggered from each other, the present invention further provides a pin sharing method according to another embodiment. Referring to FIG. 4, FIG. 4 is a flowchart of a pin sharing method according to another embodiment of the present invention. The pin sharing method according to the present embodiment can be performed by the pin sharing circuit 10' in FIG. 2, and please refer to FIG. 2 for better understanding. Detailed descriptions of the steps are disclosed in the previous embodiments and thus are not repeated. Some steps in FIG. 4 are labeled in the same way as some steps in FIG. 3, and descriptions thereof are not presented. Moreover, detailed descriptions of the steps are disclosed in the previous embodiments and thus are not repeated.

Compared to the pin sharing method in FIG. 3, the pin sharing method in FIG. 4 includes Step S301', Step S303~Step S305, and Step S401 Step S403. First, in Step S301', a stimulation signal S1 containing an AC component and a DC component is outputted from at least one first shared pin T1 on an integrated circuit 16, wherein the time the stimulation signal S1 contains the AC component and the time the stimulation signal S1 contains the DC component are staggered from each other. Then, in Step S303, a first wire 18 is used to enable the at least one first shared pin T1 on the integrated circuit 16 to be coupled to an input terminal 120 of the keyboard device 12 and an input terminal 140 of the touch panel 14, wherein the first wire 18 includes an impedance element Z1 coupled between the input terminal 120 of the keyboard device 12 and the at least one first shared pin T1. Afterwards, in Step S305, the impedance element Z1 is used to filter the stimulation signal S1 so as to filter out the AC component of the stimulation signal S1 and prevent the equivalent capacitor to be formed on the keyboard device 12 from affecting the touch panel 14.

Furthermore, in Step S401, a second wire 20 is used to enable at least one second shared pin R3 on the integrated circuit 16 to be coupled to an output terminal 122 of the keyboard device 12 and an output terminal 142 of the touch panel 14. Then, in Step S403, the at least one second shared pin R3 is used to receive a first sensor signal M1 outputted by the output terminal 122 of the keyboard device 12 and a second sensor signal M2 outputted by the output terminal 142 of the touch panel 14. Moreover, the second wire 20 may further include an impedance element Z2 coupled between the output terminal 122 of the keyboard device 12 and the at least one second shared pin R3. The impedance element Z2 is configured to filter the first sensor signal M1 so as to filter out the AC component of the first sensor signal M1 and prevent the equivalent capacitor to be formed on the keyboard device 12 from affecting the touch panel 14.

The integrated circuit 16 uses the time-sharing operations of the first shared pin T1 to differentiate the sensing results of the keyboard device 12 and the touch panel 14, such that the integrated circuit 16 can use the same input pin (i.e., the second shared pin R3) to receive the first sensor signal M1 and the second sensor signal M2 from the keyboard device 12 and the touch panel 14, respectively so as to further minimize the number of pins on the integrated circuit 16 and reduce the cost of circuit design and enhance the chip packaging yield.

Figure 5:
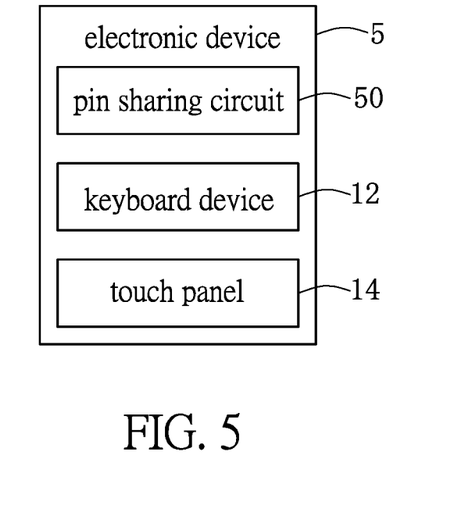
FIG. 5 is a schematic diagram of an electronic device according to one embodiment of the present invention.

The present invention embodiment provides an electronic device. Referring to FIG. 5, FIG. 5 is a schematic diagram of an electronic device according to one embodiment of the present invention. The electronic device 5 includes a pin sharing circuit 50, a keyboard device 12 and a touch panel 14. The pin sharing circuit 50 in the present embodiment can be regarded as the pin sharing circuit 10 in the previous embodiment, and please refer to FIG. 1 for better understanding. Moreover, the detailed descriptions of the elements of the electronic device 5 are disclosed in the previous embodiments and are not repeated herein.

The pin sharing circuit 50 includes an integrated circuit 16 including at least one first shared pin T1, and a first wire 18. The at least one first shared pin T1 is configured to output a stimulation signal S1 containing an AC component and a DC component. The first wire 18 is configured to enable the at least one first shared pin T1 on the integrated circuit 16 to be coupled to an input terminal 120 of the keyboard device 12 and an input terminal 140 of the touch panel 14. Moreover, the first wire 18 further includes an impedance element Z1 coupled between the input terminal 120 of the keyboard device 12 and the at least one first shared pin T1 and configured to filter the stimulation signal S1 so as to filter out the AC component of the stimulation signal S1 and prevent the equivalent capacitor to be formed on the keyboard device 12 from affecting the touch panel 14.

Considering that the time the stimulation signal S1 contains the AC component and the time the stimulation signal S1 contains the DC component are staggered from each other, the pin sharing circuit 50 in the present embodiment can also be regarded as the pin sharing circuit 10' in the previous embodiment. Please refer to FIG. 2 for better understanding. The pin sharing circuit 50 further includes at least one second shared pin R3 disposed on an integrated circuit 16 and a second wire 20. The second shared pin R3 is configured to receive a first sensor signal M1 outputted by an output terminal 122 of the keyboard device 12 and a second sensor signal M2 outputted by an output terminal 142 of the touch panel 14. Moreover, the second wire 20 is configured to enable the at least one second shared pin R3 on the integrated circuit 16 to be coupled to the output terminal 122 of the keyboard device 12 and the output terminal 142 of the touch panel 14. The second wire 20 further includes another impedance element Z2 coupled between the output terminal 122 of the keyboard device 12 and the at least one second shared pin R3 and configured to filter the first sensor signal M1 so as to filter out the AC component of the first sensor signal M1 and prevent the equivalent capacitor to be formed on the keyboard device 12 from affecting the touch panel 14. It should be understood that the present invention may be implemented by many different modes and is not limited to the electronic device 5 in the present embodiment.

It should be noted that the present invention further provides various electronic wires, which can be implemented in the pin sharing circuits 10 and 10' in FIG. 1 and FIG. 2. Please refer to FIG. 1 and FIG. 2 for better understanding. The detailed descriptions thereof are disclosed in the previous embodiments and are not repeated herein. Furthermore, since the electronic wire includes the impedance element on the conductive path, signal interference between the electronic devices connected by the electronic wire can be prevented.

As previously stated, the present invention provides a pin sharing circuit, a pin sharing method and an electronic device, an electronic wire using the same so as to enable the at least one pin on an integrated circuit to be shared by the keyboard device and the touch panel. An impedance element is added to the wire for the pin to prevent signal interference between a keyboard device and a touch panel, such that the pin can output or receive a stimulation signal and a sensor signal that contain both an AC component and a DC component so as to enhance the efficiency of the overall system and prevent the stimulation signal and the sensor signal from conflict between the keyboard device and the touch panel.

The above-mentioned descriptions represent merely the exemplary embodiment of the present invention, without any intention to limit the scope of the present invention thereto. Various equivalent changes, alterations or modifications based on the claims of present invention are all consequently viewed as being embraced by the scope of the present invention.

What is claimed is:

1. A pin sharing circuit for use between a keyboard device and a touch panel, said pin sharing circuit comprising:
   an integrated circuit comprising at least one first shared pin, wherein said first shared pin is configured to output a stimulation signal containing an alternating current (AC) component and a direct current (DC) component; and
   a first wire configured to enable said at least one first shared pin on said integrated circuit to be coupled to an input terminal of said keyboard device and an input terminal of said touch panel, wherein said first wire comprises a first impedance element coupled between said input terminal of said keyboard device and said at least one first shared pin and configured to filter said stimulation signal so as to filter out said AC component of said stimulation signal such that said AC component flowing through said keyboard device is not affecting said touch panel.

2. The pin sharing circuit of claim 1, wherein said first impedance element comprises at least one passive element and/or at least one diode.

3. The pin sharing circuit of claim 2, wherein said pin sharing circuit further comprises:
   at least one first input pin disposed on said integrated circuit and configured to receive a first sensor signal outputted by an output terminal of said keyboard device; and
   at least one second input pin disposed on said integrated circuit and configured to receive a second sensor signal outputted by an output terminal of said touch panel.

4. The pin sharing circuit of claim 2, wherein when the time said stimulation signal contains said AC component and the time said stimulation signal contains said DC component are staggered from each other, said pin sharing circuit further comprises:
   at least one second shared pin disposed on said integrated circuit and configured to receive a first sensor signal outputted by an output terminal of said keyboard device and a second sensor signal outputted by an output terminal of said touch panel; and
   a second wire configured to enable said at least one second shared pin on said integrated circuit to be coupled to said output terminal of said keyboard device and said output terminal of said touch panel, wherein said second wire comprises a second impedance element coupled between said output terminal of said keyboard device and said at least one second shared pin and configured to filter said first sensor signal so as to filter out said AC component of said first sensor signal.

5. A pin sharing method for use between a keyboard device and a touch panel, said pin sharing method comprising:

outputting a stimulation signal containing an alternating current (AC) component and a direct current (DC) component from at least one first shared pin on an integrated circuit;

using a first wire to enable said at least one first shared pin on said integrated circuit to be coupled to an input terminal of said keyboard device and an input terminal of said touch panel, wherein said first wire comprises a first impedance element coupled between said input terminal of said keyboard device and said at least one first shared pin; and using said first impedance element to filter said stimulation signal so as to filter out said AC component of said stimulation signal such that said AC component flowing through said keyboard device is not affecting said touch panel.

6. The pin sharing method of claim 5, wherein said first impedance element comprises at least one passive element and/or at least one diode.

7. The pin sharing method of claim 6, further comprising:

using at least one first input pin disposed on said integrated circuit to receive a first sensor signal outputted by an output terminal of said keyboard device; and using at least one second input pin disposed on said integrated circuit to receive a second sensor signal outputted by an output terminal of said touch panel.

8. The pin sharing method of claim 6, wherein when the time said stimulation signal contains said AC component and the time said stimulation signal contains said DC component are staggered from each other, said pin sharing method further comprises:

using a second wire to enable at least one second shared pin on said integrated circuit to be coupled to an output terminal of said keyboard device and an output terminal of said touch panel; and using said at least one second shared pin to receive a first sensor signal outputted by said output terminal of said keyboard device and a second sensor signal outputted by said output terminal of said touch panel;

wherein said at least one second wire comprises a second impedance element coupled between said output terminal of said keyboard device and said at least one second shared pin and configured to filter said first sensor signal so as to filter out said AC component of said first sensor signal.

9. An electronic device, comprising:
a keyboard device;
a touch panel; and
a pin sharing circuit, comprising:
    an integrated circuit comprising at least one first shared pin and at least one second shared pin configured to receive a first sensor signal outputted by an output terminal of said keyboard device, wherein said first shared pin is configured to output a stimulation signal containing an alternating current (AC) component and a direct current (DC) component; and
    a first wire configured to enable said at least one first shared pin on said integrated circuit to be coupled to an input terminal of said keyboard device and an input terminal of said touch panel, and a second wire configured to enable said at least one second shared pin on said integrated circuit to be coupled to said output terminal of said keyboard device and said output terminal of said touch panel, wherein said second wire comprises a first impedance element coupled between said output terminal of said keyboard device and said at least one second shared pin and configured to filter said stimulation signal so as to filter out said AC component of said stimulation signal so as to prevent said AC component from entering into said integrated circuit.

10. The electronic device of claim 9, wherein said first impedance element comprises at least one passive element and/or at least one diode.

11. The electronic device of claim 9, wherein said pin sharing circuit further comprising:

at least one first input pin disposed on said integrated circuit and configured to receive said first sensor signal outputted by said output terminal of said keyboard device; and at least one second input pin disposed on said integrated circuit and configured to receive a second sensor signal outputted by an output terminal of said touch panel.

12. The electronic device of claim 9, wherein said at least one second shared pin is configured to receive a second sensor signal outputted by an output terminal of said touch panel; and wherein said first wire comprises a second impedance element coupled between said input terminal of said keyboard device and said at least one first shared pin and configured to filter said first sensor signal so as to filter out said AC component of said first sensor signal.

* * * * *